United States Patent

Fay et al.

(10) Patent No.: US 7,425,464 B2
(45) Date of Patent: Sep. 16, 2008

(54) SEMICONDUCTOR DEVICE PACKAGING

(75) Inventors: Owen R. Fay, Gilbert, AZ (US); Kevin R. Lish, Gilbert, AZ (US); Douglas G. Mitchell, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 109 days.

(21) Appl. No.: 11/373,423

(22) Filed: Mar. 10, 2006

(65) Prior Publication Data

US 2007/0210461 A1    Sep. 13, 2007

(51) Int. Cl.
*H01L 21/00*    (2006.01)

(52) U.S. Cl. .................. 438/107; 438/110; 438/113; 438/125; 438/126; 438/127

(58) Field of Classification Search .............. 355/53, 355/72; 438/3, 33, 68, 107, 113, 238, 460–465; 327/55
See application file for complete search history.

(56) References Cited

U.S. PATENT DOCUMENTS

| | | | |
|---|---|---|---|
| 4,918,811 | A | 4/1990 | Eichelberger |
| 5,032,543 | A | 7/1991 | Black et al. |
| 5,144,747 | A | 9/1992 | Eichelberger |
| 5,250,843 | A | 10/1993 | Eichelberger |
| 5,866,952 | A | 2/1999 | Wojnarowski et al. |
| 6,093,584 | A | 7/2000 | Fjelstad |
| 6,159,767 | A | 12/2000 | Eichelberger |
| 6,770,822 | B2 | 8/2004 | Pasternak et al. |
| 6,778,406 | B2 | 8/2004 | Eldridge et al. |
| 6,838,776 | B2 | 1/2005 | Leal et al. |
| 6,921,975 | B2 | 7/2005 | Leal et al. |
| 2002/0027010 | A1 * | 3/2002 | Glenn ................ 174/52.2 |
| 2002/0197842 | A1 * | 12/2002 | Kuo et al. ............ 438/613 |
| 2005/0269676 | A1 * | 12/2005 | Lee et al. ............ 257/678 |
| 2006/0046350 | A1 * | 3/2006 | Jiang et al. .......... 438/114 |
| 2007/0045875 | A1 * | 3/2007 | Farnworth et al. ..... 257/787 |

FOREIGN PATENT DOCUMENTS

WO    WO 02/33751    4/2002

* cited by examiner

*Primary Examiner*—Fernando L. Toledo
*Assistant Examiner*—Jae Lee
(74) *Attorney, Agent, or Firm*—Ingrassia, Fisher & Lorenz, P.C.

(57) ABSTRACT

Methods and apparatus are provided for encapsulating electronic devices, comprising: providing one or more electronic devices (62) with primary faces (63) having electrical contacts (69), opposed rear faces (65) and edges (64) therebetween. A sacrificial layer (70) is provided on the primary faces (63). The devices (62) are mounted on a temporary support (80) so that the sacrificial layer (70) faces toward the temporary support (80). A plastic encapsulation (86) is formed in contact with at least the lateral edges (64) of the electronic devices (62). The plastic encapsulation (86) is at least partially cured and the devices (62) and plastic encapsulation (86) separated from the temporary support (80), thereby exposing the sacrificial layer (70). The sacrificial layer (70) is removed. The devices (62) and edge-contacting encapsulation are mounted on a carrier (90) with the primary faces (63) and electrical contacts (69) exposed and, optionally, further cured. Insulators (94) and conductors (96) applied to the primary faces couple electrical contacts (69) on various devices (62) to each other and to external contacts, thereby forming an integrated multi-device panel (88").

18 Claims, 6 Drawing Sheets

SEMICONDUCTOR DEVICE PACKAGING

TECHNICAL FIELD

The present invention generally relates to electronic devices, and more particularly relates to packaging of semiconductor and other types of chip devices.

BACKGROUND

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially planar. Accordingly, such other types of devices including the non-limiting examples given below, are intended to be included in the terms "device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Certain types of electronic devices are intended to be only partly encapsulated so that their electrical contacts, for example the bonding pads on the partially enclosed die or chips are still exposed after encapsulation. The rear faces and edges of the die or chips may be covered by the encapsulation but the primary contact faces of the die or chips are not intended to be covered by the encapsulation. They are intended to remain encapsulation free so that external electrical connections can be made thereon after the encapsulation process. Unfortunately, it is sometimes happens, that during encapsulation of the rear faces and/or edges of the die or chips, the encapsulation resin leaks onto these primary contact faces and onto some of the bonding pads, thereby interfering with subsequent connections. This is referred to as "resin bleed" and can reduce the manufacturing yield and increases the cost of producing such partially encapsulated assemblies or panels. Thus, there is an ongoing need for improved structures and methods which avoid or minimize such problems.

Accordingly, it is desirable to provide packaging arrangements and methods for semiconductor and other types of electronic devices that avoid or mitigate the adverse effects of resin bleed during encapsulation. It is further desirable that the packaging is suitable for use with arrays containing multiple devices and/or multiple types of devices and especially device arrays, where it is desired that the primary faces of the devices are available for electrical connections thereto after the devices are fixed in the encapsulation. In addition, it is desirable that the methods, materials and structures employed be compatible with present day manufacturing capabilities and materials and not require substantial modifications of manufacturing procedures or substantially increase manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
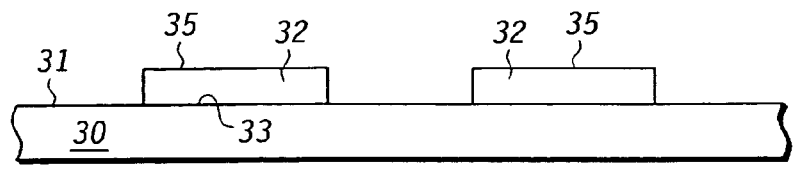
FIGS. 1-3 are simplified schematic cross-sectional views of plastic encapsulation process steps for forming a plastic encapsulation in which multiple semiconductor (or other) devices are intended to have their primary connection faces exposed after encapsulation.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down, "top," "bottom," "over," "under," "above," "below" and the like in the and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner. The term "bonding pad" singular or plural is intended to refer to any type of electrical connection place on a device and is not limited merely to those suitable for electrical connection by bonding a wire or other lead.

Figure 2:
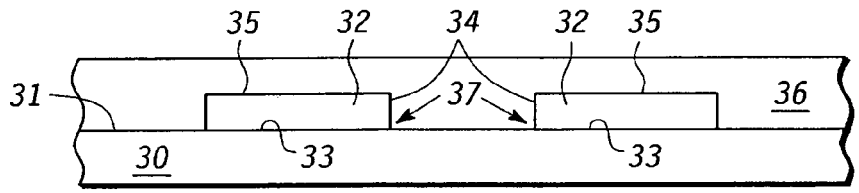
Figure 3:
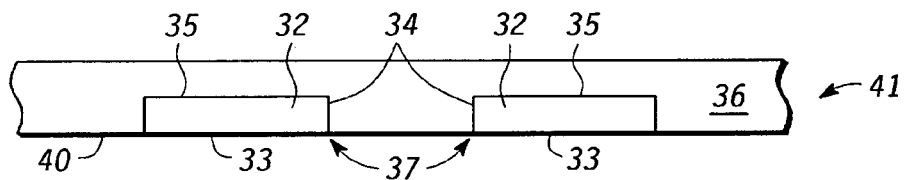
Figure 4:
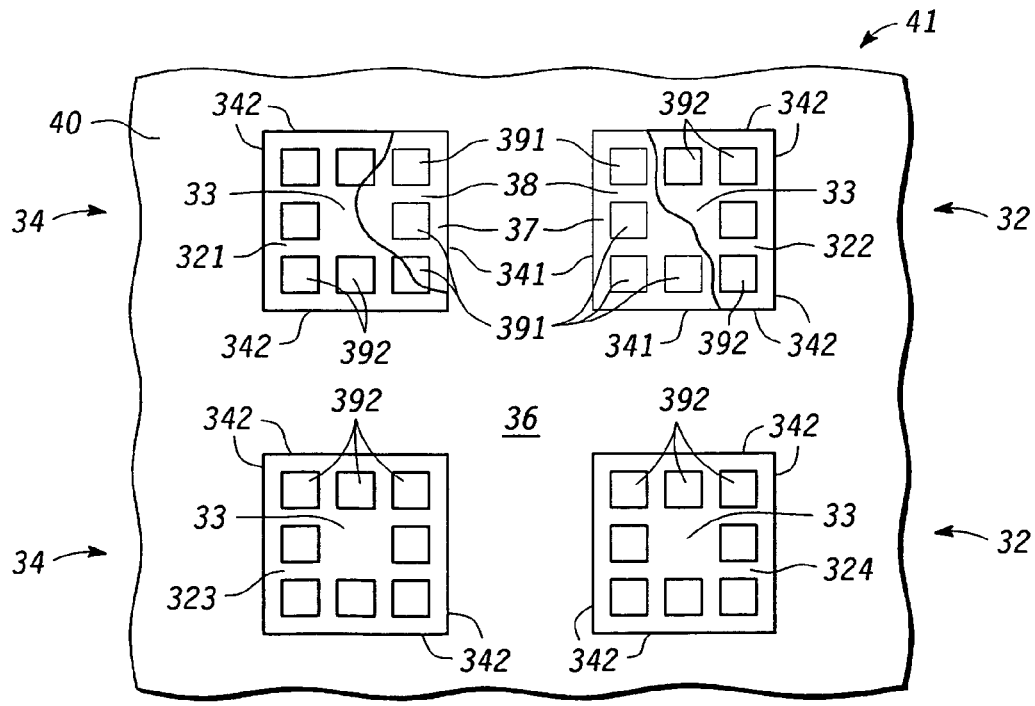
FIG. 4 shows a plan view of the encapsulated semiconductor devices resulting from the process steps of FIGS. 1-3 and illustrating the occurrence of resin bleed.

FIGS. 1-3 are simplified schematic cross-sectional views of plastic encapsulation process steps 20, 22, 24 for forming a plastic device package or panel in which multiple semiconductor devices are encapsulated so as to leave their primary contact faces exposed, and FIG. 4 shows plan view 26 of the encapsulated device panel resulting from process steps 20, 22, 24, and illustrating the occurrence of resin bleed. In step 20 of FIG. 1, temporary substrate 30 is provided having upper surface 31 on which semiconductor devices (e.g., integrated circuits) are mounted with their primary faces 33 in contact with surface 31 of substrate 30. As used herein the term "primary face" or "primary contact face" either singular or plural, refers to the face of the electronic device (e.g., an integrated circuit dice) on which are located its principal electrical connections (not shown in FIGS. 1-3, see FIG. 4). Rear faces 35 of devices 32 remain exposed in step 20. In step 22 of FIG. 2, rear faces 35 and edges 34 of devices 32 and the remaining portions of surface 31 of substrate 30 are covered with plastic encapsulation resin 36. Primary faces 33 of devices 32 are not intended to be covered by or exposed to encapsulation resin 36, but this may happen through resin bleed. After resin 36 is cured, then in step 24 of FIG. 3, temporary substrate 30 is removed or separated from resin 36 and devices 32, so that lower surface 40 of resin 36 and primary faces 33 of devices or die 32 are exposed, thereby providing packaged device panel 41.

FIG. 4 shows plan view 26 looking toward surface 40 of packaged device panel 41. For convenience of explanation and not intended to be limiting, packaged device panel 41 in FIG. 4 includes four multi-contact devices 32 identified as devices 321, 322, 323, 324, but more or fewer devices and different types of devices and different size devices may be included in panel 41. Devices 32 are held in plastic encapsulation resin 36 by edges 34 (e.g., 341, 342, etc.) and rear faces 35 (see FIGS. 2-3). Devices 32 have, in this example, electrical connection locations 391, 392, referred to conveniently as "bonding pads." Primary contact faces 33 and electrical connection locations (i.e., "bonding pads") 392 of devices 323, 324 are fully exposed on surface 40 of resin 36, as is desired. Devices 321, 322 illustrate resin bleed regions 38 at interfaces 37 of devices 321, 322 where resin 36 has encroached on primary surfaces 33 of devices 321, 322 adjacent edges 341 so that electrical connection locations 391 are covered with a thin skin of resin 36. Since this resin bleed can interfere with making good electrical connection to devices 32, it is undesirable and there is a need for packaging methods that avoid resin bleed.

FIGS. 5-14 are simplified schematic cross-sectional views 50-59 analogous to those of FIGS. 1-3 of electronic device plastic encapsulation at different stages of manufacture, according to an embodiment of the present invention. In FIGS. 5-14, to avoid undue crowding of various lines and regions and enhance clarity, vertical dimensions of the various elements and layers have been exaggerated compared to their horizontal dimensions. Referring now to manufacturing stage 50 of FIG. 5, semiconductor (or other device) wafer 60 of thickness 43 is made or provided using technologies well known in the art, in which individual devices, integrated circuits or other elements 62 (collectively "devices" 62) have already been formed, spaced apart in wafer 60 by scribe grids or saw streets or other separation channels 64. Thickness 43 is typically about 0.3 to 0.85 mm, but larger or smaller thicknesses may also be used. For convenience of illustration, each device 62 is shown with bonding pad 69 (i.e., an electrical connection of some sort) on primary surface 63 of wafer 60, but this is not intended to be limiting and, as will be understood by persons of skill in the art, multiple bonding pads may be included in devices 62. Accordingly, "bonding pad 69" (singular or plural) is intended to represent such multiple bonding pads. In stage 50 of FIG. 5, devices 62 have not yet been singulated, that is, separated into individual die or chips, but still remain a part of wafer 60. Sacrificial layer 70 of thickness 45 has been applied to surface 63 of wafer 60 (and die 62). Layer 70 is removed later in the process taking with it any resin bleed that may form over surface 71 during encapsulation. Sacrificial layer 70 is conveniently of photoresist, as for example, type AZ4620 manufactured by AZ Electronics of New Jersey, but any material can be used that can withstand the subsequent processing and be later dissolved without adversely affecting the encapsulated device. Sacrificial layer 70 with outer surface 71 has thickness 45 conveniently in the range of about 2 to 15 microns, preferably about 7 microns. When photo-resist is used for layer 70 it is conveniently applied by a standard spin-on process, but other techniques and materials may also be used. Non-limiting examples of other techniques are: evaporation, sputtering, plasma deposition and screen printing. Non-limiting examples of other materials are: glasses, other organic or inorganic dielectrics and combinations thereof. It is preferred that sacrificial layer 70 be applied while die 62 are still in wafer form as shown in manufacturing stage 50 of FIG. 5, since such approach usually provides lower cost, but this is not essential and layer 70 may be applied after singulation step 51 of FIG. 6. In step 51 of FIG. 6, die 62 of wafer 60 are separated by sawing or scribe-and-break or any other well known techniques for dividing wafer 60 into its individual die or other elements 62. As used herein the terms "singulate", singulating", "singulation" and "singulated" refer to such die separation processes.

Figure 5:
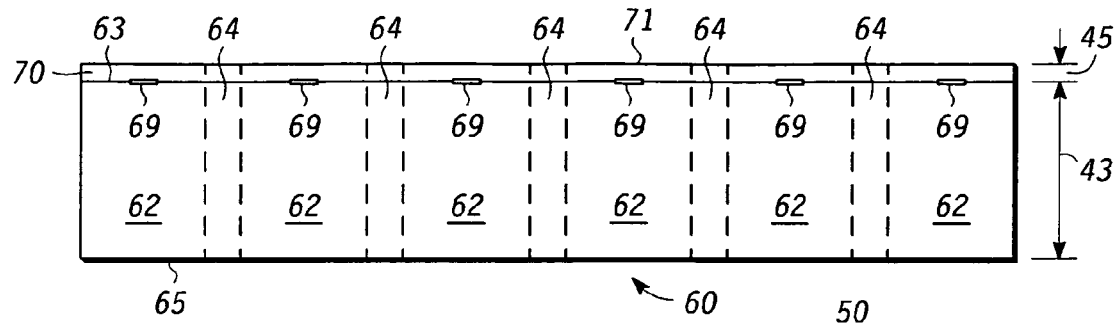
FIGS. 5-14 are simplified schematic cross-sectional views analogous to those of FIGS. 1-3 of electronic device plastic encapsulation at different stages of manufacture, according to an embodiment of the present invention.
Figure 6:
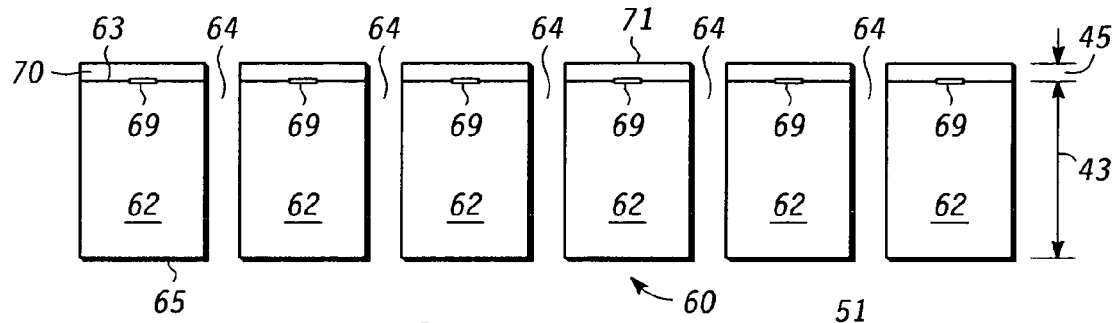
Figure 7:
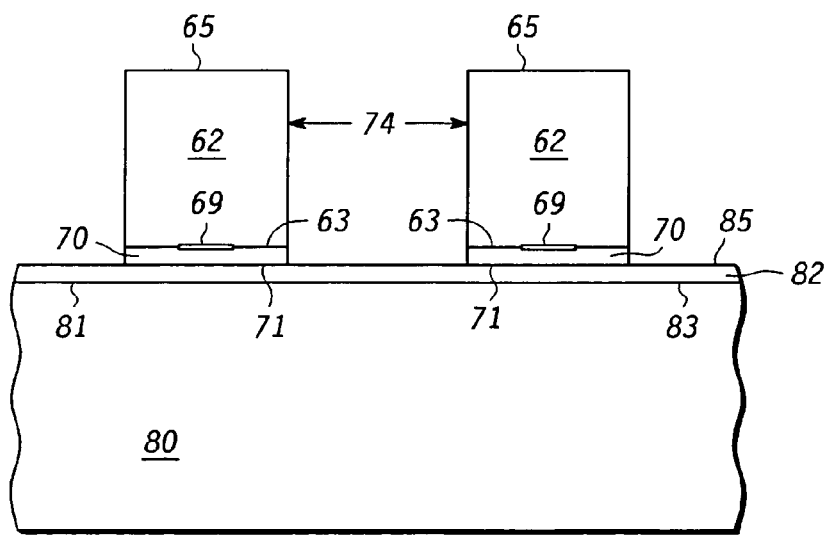

In FIGS. 7-10 illustrating manufacturing stage 52-55, individual die 62 are inverted compared to their orientation in FIGS. 5-6 illustrating manufacturing stages 50-51. In manufacturing stage 52 of FIG. 7, individual die 62 are mounted face-down on temporary substrate 80, that is, with primary die faces 63 and sacrificial layer 70 facing toward surface 81 of temporary substrate 80. For convenience of description and not intended to be limiting, only two die 62 are illustrated in FIGS. 7-14, but persons of skill in the art will understand that any number of die 62 consistent with the available tool capacity and substrate size may be placed on substrate 80. Substrate 80 is analogous to substrate 30 of FIGS. 1-2. Substrate 80 is conveniently of porous ceramic, for example, alumina of approximately 0.5 micro-meter continuous porosity manufactured by Refractron Technologies of New York, USA, but other comparatively inert porous materials may also be used. It is preferably porous to assist in later separating it from the encapsulated devices. Die 62 are conveniently mounted on temporary substrate 80 using thin temporary adhesive layer 82 having lower surface 83 in contact with upper surface 81 of temporary substrate 80. Double sided polyimide sticky-tape type with silicone adhesive on both sides manufactured by Permacel of New Jersey is preferred, but other types of non-permanent adhesive materials may also be used. What is important is that adhesive layer 82 withstand the subsequent processing without becoming brittle or permanently fixed in place, since at a later stage of manufacture, die 62 will be separated from adhesive layer 82. Outer surface 71 of sacrificial layer 70 is placed on outer surface 85 of adhesive layer 82. In stage 52 of FIG. 7, rear faces 65 of die 62 are still exposed and die 62 are spaced-apart on temporary support substrate 80 by distance 74 corresponding substantially to their desired spacing in the finished package, taking into account any shrinkage or differential expansion of the materials during subsequent processing.

Figure 8:
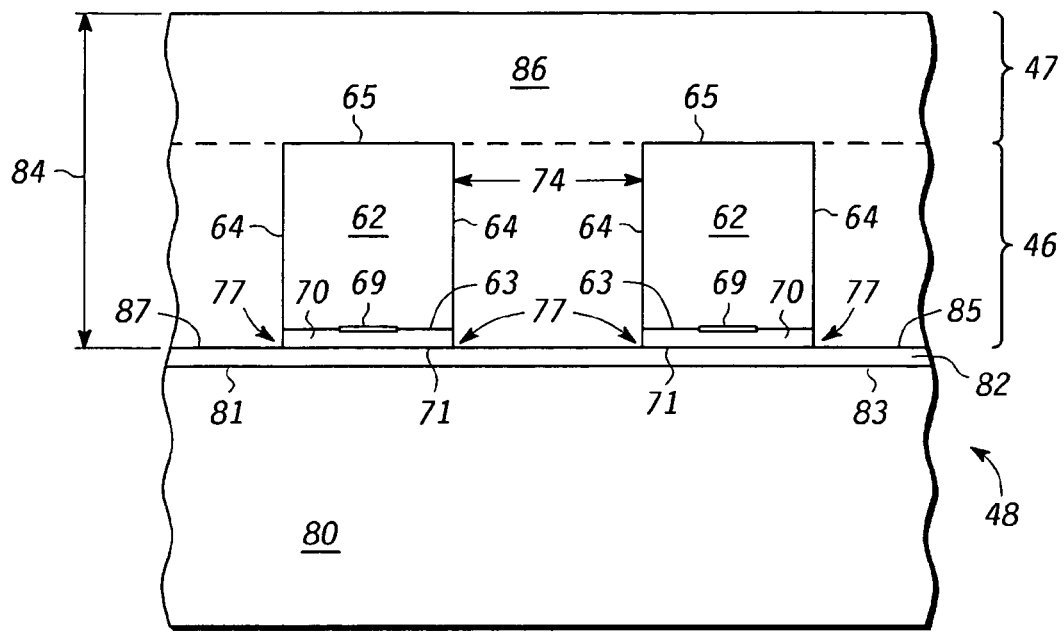
Figure 9:
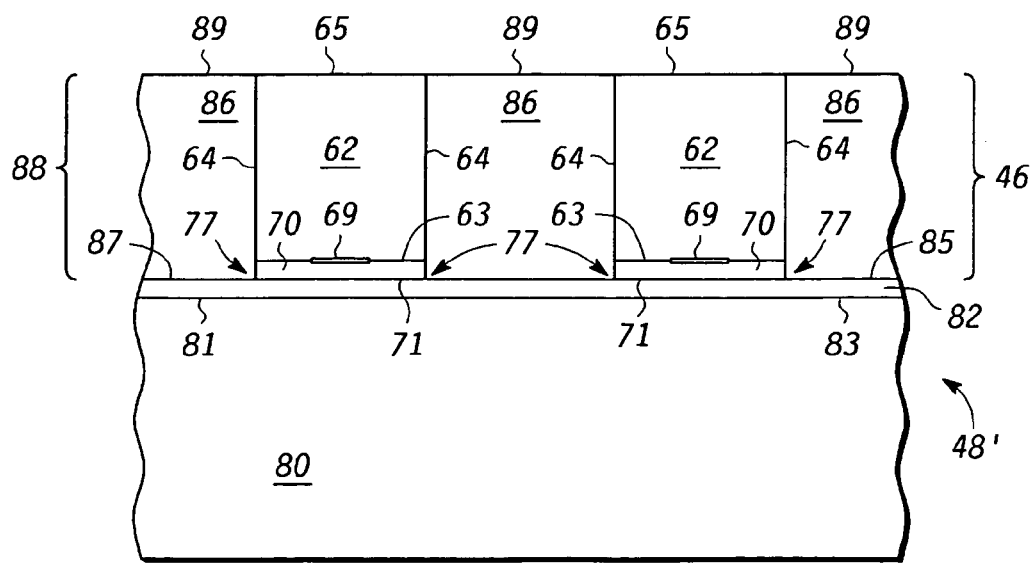

In manufacturing stage 53 of FIG. 8, plastic encapsulation resin 86 analogous to resin 36 of FIG. 2 is provided over rear faces 65 of die 62, die edges 64 and the remaining exposed portions of surface 85 of adhesive layer 82. Type R1007RC-H resin, including variations of type R1007RC-H silica filled epoxy manufactured by the Nagase company of Tokyo, Japan is a suitable material, but other well known encapsulants can also be used. During this manufacturing stage, resin bleed may occur at interfaces 77 (analogous to interfaces 37 of FIG. 2-4) between surface 71 of sacrificial layer 70 and surface 85 of adhesive layer 82. Sacrificial layer 70 prevents such resin bleed from reaching surface 63 of die 62 and/or bonding pads 69, which are protected by sacrificial layer 70. In optional manufacturing stage 54 of FIG. 9, portion 47 (see FIG. 8) of encapsulation resin 86 lying above rear faces 65 of die 62 may be removed (e.g., by grinding or chemical etching or other convenient techniques) to expose rear faces 65 of die 62. This is referred to conveniently as "backgrind" or "backgrinding" even though other techniques besides grinding may be used to remove portion 47 of encapsulation resin 86, and such other techniques are intended to be included in the terms "backgrind" and "backgrinding." Backgrinding facilitates bringing a heat sink in direct contact with rear faces 65 of die 62, but is not essential. After backgrinding stage 54, exposed rear face 89 of encapsulation resin 86 is substantially coplanar with rear faces 65 of die 62, but this is not essential. In manufacturing stage 55 of FIG. 10, temporary support substrate 80 and adhesive layer 82 are removed, thereby exposing surface 87 of encapsulation resin 86 and surface 71 of sacrificial layer 70, and forming free-standing encapsulated multiple device panel or package 88 wherein die 62 are held in place in by their edges 64 embedded in encapsulation resin 86.

Figure 10:
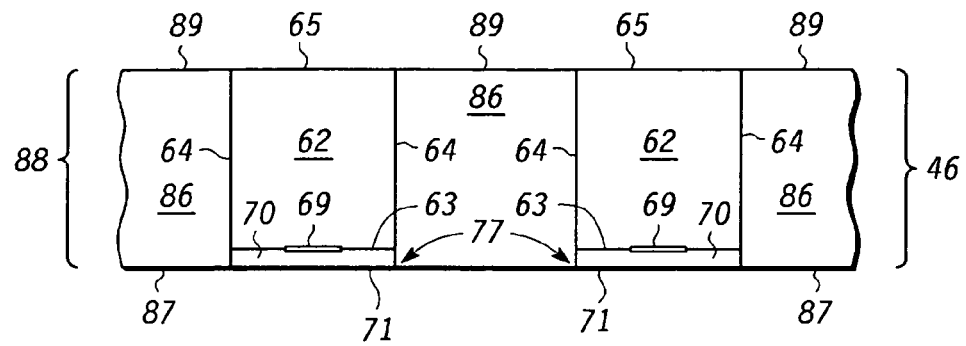

In FIGS. 11-14 illustrating manufacturing stages 56-59, encapsulated multiple device panel 88 is inverted relative to its orientation in FIG. 10, but this is merely for convenience of explanation and not intended to be limiting. In manufacturing stage 56 of FIG. 11, sacrificial layer 70 is removed from primary contact surfaces 63 and bonding pads 69 of die 62. When sacrificial layer 70 is of photo-resist, this is conveniently accomplished using type AZ300T solvent or developer supplied by AZ Electronics of New Jersey. Bonding pads 69 on various die 62 are now exposed and available for interconnection in any manner desired by the panel designer. In this way, extraordinarily complex functions may be provided in panel 88, since multiple die 62 of different types and functions may be combined and interconnected in a single panel. This is a great convenience where it is desired to use different chips or die made from different materials by different processes to optimize overall performance.

Figure 11:
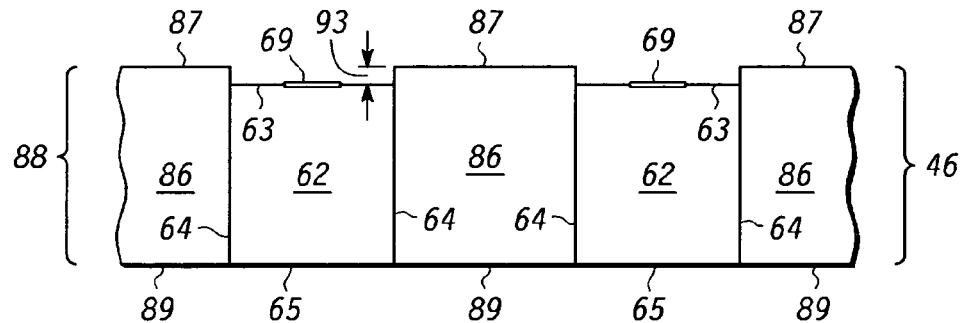
Figure 12:
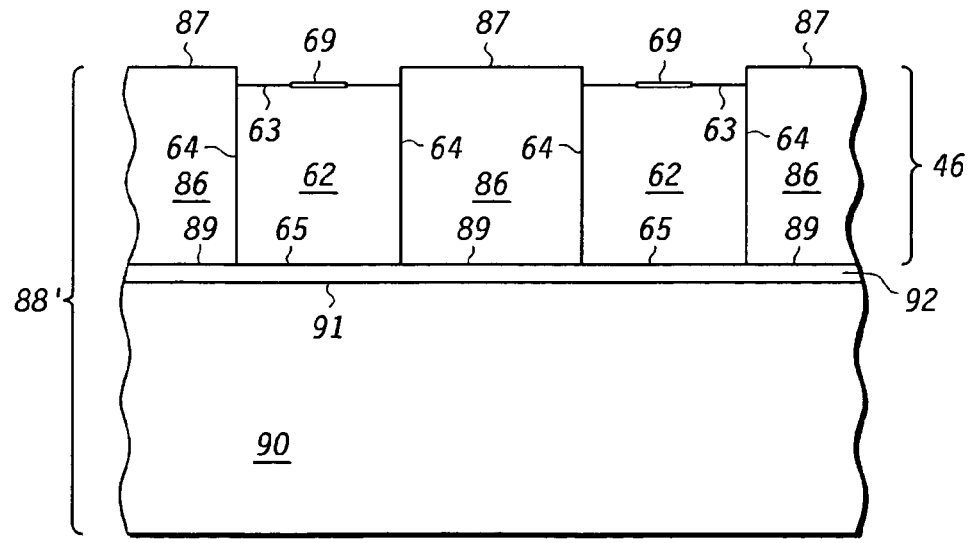
Figure 13:
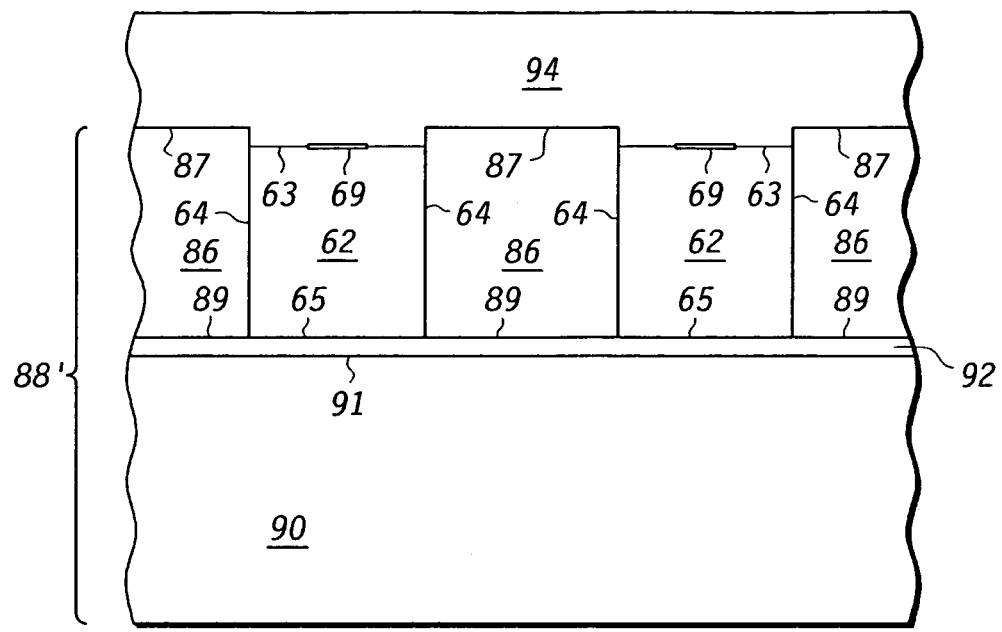
Figure 14:
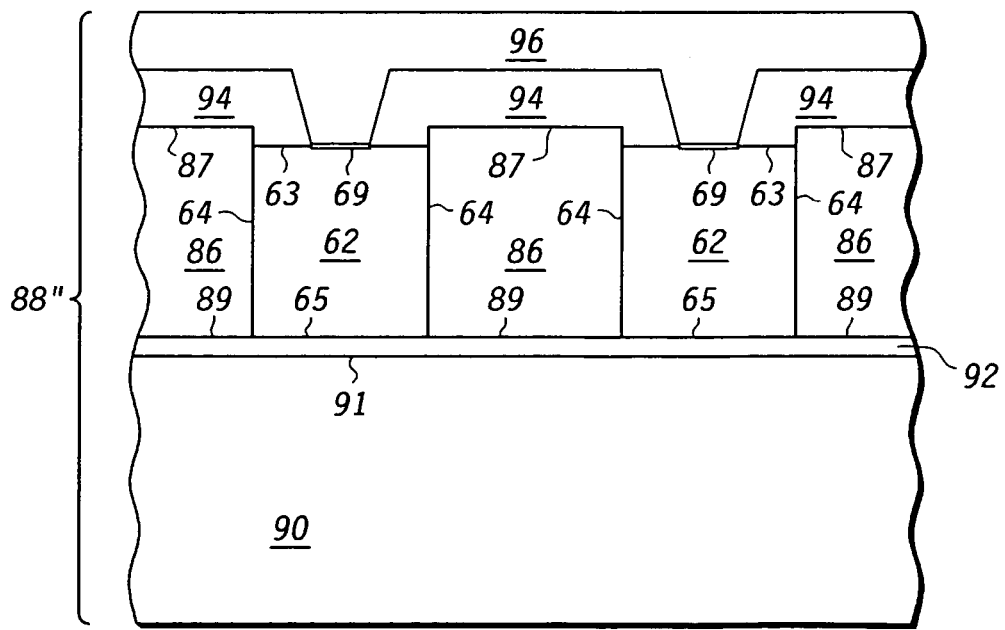

In manufacturing stage 57 of FIG. 12, encapsulated multiple device panel 88 is desirably but not essentially mounted over surface 91 of support carrier 90 of, for example, alumina, silicon or sapphire, but other material may also be used. Non-limiting examples of suitable support carrier materials are, other semiconductor wafers, various ceramics, glasses, plastics, plastic laminates, metals and insulator coated metals. Adhesive layer 92 is conveniently used to affix panel 88 to upper surface 91 of support carrier 90, thereby providing combined panel 88', but this is not essential and any relatively stress free attachment means may be used. Double-sided sticky-tape analogous to that used for layer 82 is preferred. Use of support carrier 90 is convenient for subsequent processing of panel 88, 88' but is not essential. Panel 88, 88' is useable as is, or may be further processed as illustrated in FIGS. 13-14 with or without support carrier 90. Support carrier 90 is desirable to minimize handling damage to panel 88, 88'. Also, manufacturing stage 56 of FIG. 11 and stage 57 of FIG. 12 may be interchanged, that is, removal of sacrificial layer 70 may be performed before or after panel 88 is mounted on support carrier 90. Either sequence is useful, but the sequence illustrated is preferred since it gives greater latitude in the choice of adhesive 92 and minimizes panel breakage.

In optional manufacturing stage 58 of FIG. 13, insulating layer 94 is provided over surface 63 of die 62 and surface 87 of encapsulation resin 86. Organic polymers in liquid or dry film form are suitable for insulating layer 94, but a wide range of other materials well known in the art for interlayer dielectrics may also be used. In manufacturing stage 59 of FIG. 14, layer 94 is patterned and etched to expose bonding pads 69 on die 62 and conductor 96 is applied to interconnect various bonding pads 69 on die 62 to provide panel 88" comprising whatever circuit or system configuration is desired by the designer of panel 88, 88', 88". Conductor 96 may be metal, metal alloy, doped semiconductor, semi-metals, and/or combinations thereof. Such materials and techniques for applying them are well known in the art. While only a single bonding pad is shown in FIG. 14 as being connected and only to an adjacent die, this is merely for convenience of illustration of the general principal and not intended to be limiting. Persons of skill in the art will understand based on the teachings herein that bonding pads 69 and die 62 are representative of multiple bonding pads present on multiple die of the same or different types, and that any number of bonding pads 69 on any of die 62 may be interconnected in any desired combination to any bonding pads 69 on the same or any other die 62 or other active or passive device in panel 88, 88' so as to form interconnected device array panel 88" illustrated generally in FIG. 14.

Figure 15:
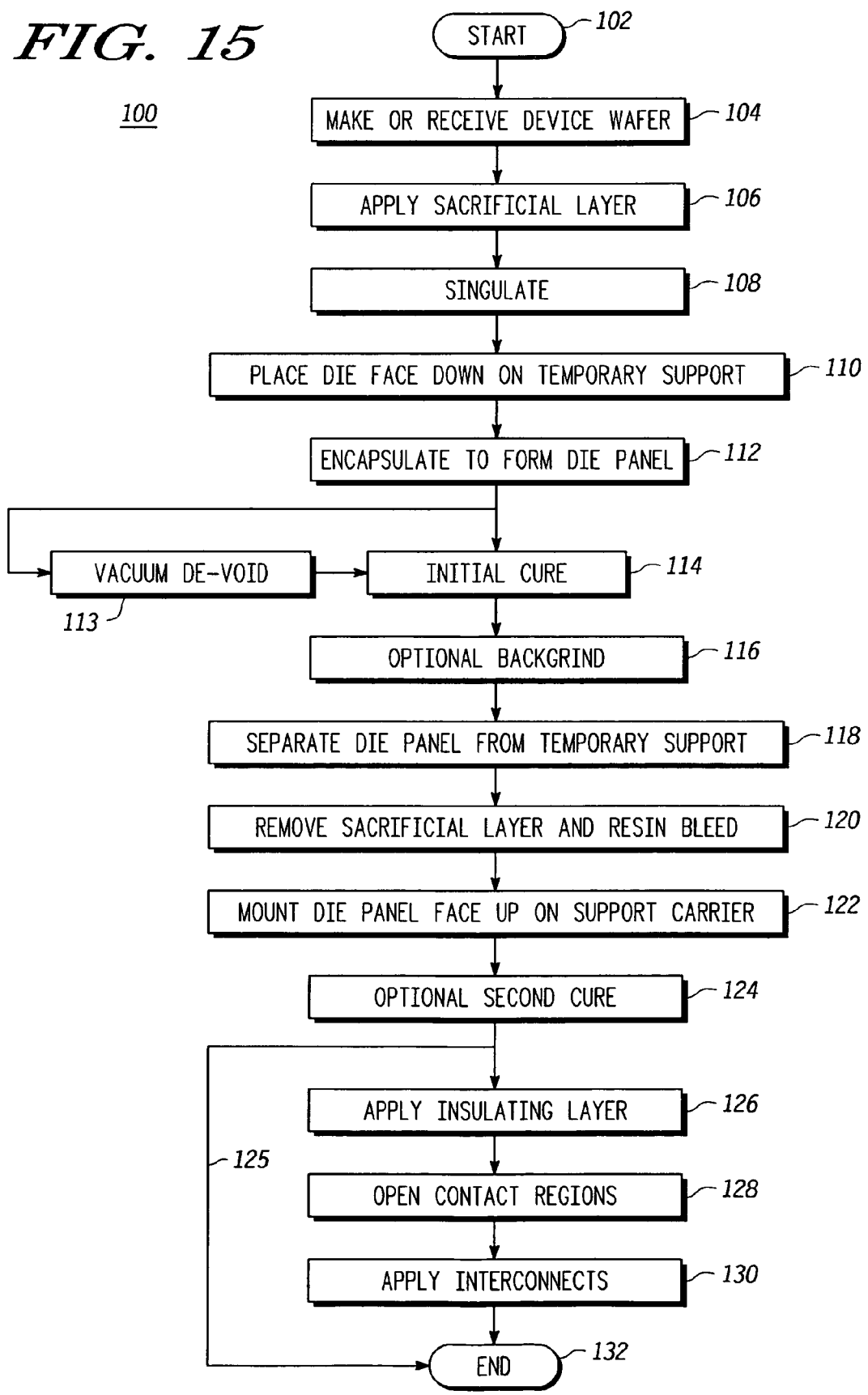
FIG. 15 illustrates a method of plastic encapsulation of electronic devices, incorporating the manufacturing stages of FIGS. 5-14, but according to a further embodiment of the present invention and showing further details.

FIG. 15 illustrates method 100 for plastic encapsulation of electronic devices, incorporating the manufacturing stages of FIGS. 5-14, but according to a further embodiment of the present invention and showing further details. Method 100 begins at START 102 and initial MAKE OR RECEIVE DEVICE WAFER step 104, wherein wafer 60 of FIG. 5 is fabricated or obtained from a wafer foundry, using design and fabrication techniques well known in the art. At this stage of manufacture, die 62 are desirably fully formed in wafer 60. The present invention does not depend upon the exact nature of die 62 and they can be, for example, integrated circuits, individual devices, filters, magnetostrictive devices, electro-optical devices, electro-acoustic devices, integrated passive devices such as resistors, capacitors and inductors, or other types of elements and/or combinations thereof, and can be formed of any materials able to withstand the encapsulation process. Non limiting examples are various organic and inorganic semiconductors, type IV, III-V and II-VI materials, glasses, ceramics, metals, semi-metals, inter-metallics and so forth. In step 106, sacrificial layer 70 is applied over primary face 63 of wafer and die 62 as has already been described. In step 108, wafer 60 is singulated, that is, individual die 62 of wafer 60 are cut or broken apart so that each die 62 is separated from the others originally contained in wafer 60. Alternatively, steps 106 and 108 may be performed in opposite order, that is, first singulated and then have sacrificial layer 70 applied to surfaces 63 of die 62. Either arrangement is useful. The sequence shown in FIG. 15 is preferred but not essential.

In subsequent step 110, die 62 with sacrificial layer 70 over surfaces 63 are placed face down on temporary support substrate 80, that is, with surface 63 facing toward surface 81 of temporary support 80. It will be appreciated that die 62 are not restricted to those coming from a single wafer 60, but may originate from multiple wafers 60 of various types, so that die 62 having various different functions and of different materials may be combined on substrate 80. Accordingly, as used herein the terms "die" and "die 62" are intended to include die from multiple wafers of various types. Step 110 corresponds to manufacturing stage 52 described in connection with FIG. 7, wherein, in a preferred embodiment, die 62 are attached to support substrate 80 by adhesive layer 82, as has already been described. In step 112, temporary support substrate 80 with die 62 is covered by encapsulation resin 86 of thickness 84 as described in connection with FIG. 8, with portion 46 filling in the interstices between edges 64 of die 62 and portion 47 overlying rear faces 65 of die 62. In optional step 113, assembly 48 of FIG. 8 is subjected to a brief vacuum treatment (e.g., 1-5 minutes at 50 milli-Torr to 15 Torr, depending upon the encapsulant being used) to remove voids that might be present in encapsulation resin 86. This is desirable but not essential. Either following vacuum de-void step 113 or progressing directly from encapsulation step 112, then INITIAL CURE step 114 is desirably performed. It as been found that heating in nitrogen or a substantially inert gas for 30-90 minutes at 50-120° C. is useful, with about 60 minutes at about 100° C. being preferred. Temperatures above this can render a photo resist sacrificial layer difficult to remove. The purpose of INITIAL CURE step 114 is to provide sufficient curing of encapsulation 86 to increase its mechanical strength and bond to die 62 so as to tolerate subsequent processing, without curing sacrificial layer 70 enough to prevent its removal in step 120 The optimum initial curing conditions will depend upon the choice of material for sacrificial layer 70. Persons of skill in the art will understand how to choose the combination of sacrificial layer 70 and initial cure step 114 to accomplish this. Optional backgrind step 116 may then be performed as has already been described in connection with FIG. 9 wherein portion 47 of encapsulation resin 86 is removed by grinding, etching, a combination thereof or other convenient means, leaving portion 46 with interspersed die 62, to form assembly 48'. Portion 46 is desirably about 0.2-1.0 mm thick with about 0.65 mm being preferred. If wet grinding is used during optional backgrind step 116, it is desirable to subject assembly 48' to a brief drying cycle to remove any moisture that may have been absorbed during backgrind. About 10-20 minutes at 80-120° C. is useful with about 15 minutes at about 100° C. being preferred, again taking care not to excessively cure sacrificial layer 70 so as to preclude its removal in step 120.

In step 118, multiple device panel 88 is separated from temporary support substrate 80 as shown in connection with FIG. 10. Substrate 80 can be released from multiple device panel 88 by soaking panel 88 and substrate 80 in solvents that soften adhesive layer 82. The choice of solvent will depend on the choice of adhesive layer 82. In a preferred embodiment where adhesive layer 82 comprises double sided polyimide tape with silicone adhesive surfaces, acetone is a suitable solvent. The resulting structure is shown in FIG. 10. Sacrificial layer 70 is now exposed and is removed in step 120, for example, using photoresist solvents in a preferred implementation. The result is shown in FIG. 11. Multiple device panel 88 is useful as is, but is preferably mounted on support carrier 90 as indicated in step 122 and shown in FIG. 12. In a preferred embodiment, adhesive 92 is used to mount multiple device panel 88 on support carrier 90, as has already been described in connection with FIG. 12, thereby forming reinforced multiple device panel 88'. In subsequent step 124, a second cure is desirably but optionally performed so as to further cure remaining portion 46 of encapsulation resin 86. In a preferred embodiment, second cure step 124 is performed in the range of about 120-170° C. for 45-90 minutes, more preferably at about 150° C. for 60 minutes, in air or nitrogen, but longer or shorter times and higher or lower temperatures may be used depending upon the choice of materials for encapsulation resin 86. Persons of skill in the art will understand based on the teachings herein, how to select optimum second cure conditions depending upon their choice of encapsulation resins. Composite multiple device panel or assembly 88' is useful at this stage since bonding pads or other connection locations 69 are exposed on surfaces 63 of die 62 and, as indicated by path 125, process 100 can optionally proceed to END 132, depending upon the needs of the designers or users of multiple device panel or assembly 88'. Alternatively, method 100 can further proceed to APPLY INSULATING LAYER step 126 wherein insulating layer 94 is formed over panel 88' as described in connection with FIG. 13. OPEN CONTACT REGIONS step 128 is then performed, wherein contact holes are cut in layer 94 exposing those of bonding pads 69 that are desired to be electrically connected and/or interconnected. Then APPLY INTERCONNECTS step 130 is executed wherein conductor 96 applied, as described for example in connection with FIG. 14. Encapsulated multiple device assembly or composite multiple device panel 88" shown in FIG. 14 is obtained. Method 100 then proceeds to END 132. Persons of skill in the art will understand based on the teachings herein, that steps 126-130 may be repeated as often as is desired to provide multilayer interconnections within panel 88".

According to a first exemplary embodiment there is provided a method for encapsulating electronic devices, comprising, providing one or more electronic devices with primary faces where electrical contacts are located, opposed rear faces, and edges extending between the primary and rear faces, and having a sacrificial layer on the primary faces, mounting the one or more electronic devices on a temporary support so that the sacrificial layer faces toward the temporary support, providing plastic encapsulation in contact with the rear faces and edges of the electronic devices, at least partially curing the plastic encapsulation, separating the devices and at least that portion of the plastic encapsulation in contact with the edges of the electronic devices from the temporary support so that the sacrificial layer is exposed, and removing the sacrificial layer. In a further embodiment, the mounting step comprises, providing a temporary support having an adhesive layer on a principal surface, and attaching the electronic devices to the temporary support by placing the sacrificial layer in contact with the adhesive layer. In a still further embodiment, the adhesive layer comprises a double-sided sticky-tape. In a yet further embodiment, the double-sided sticky-tape comprises a polyimide material. In a still yet further embodiment, the step of at least partially curing the plastic encapsulation comprises, partially curing the plastic encapsulation without rendering the sacrificial layer insoluble. In a yet still further embodiment, the method comprises prior to the separating step, backgrinding the plastic encapsulation to expose the rear faces of the one or more electronic devices. In an additional embodiment, the method further comprises after the step of removing the sacrificial layer, mounting the rear faces of the die on a support carrier. In a yet additional embodiment, the method comprises after the step of mounting the rear faces of the die on a support carrier, further curing the plastic encapsulation. In a still additional embodiment, the method further comprises applying an insulating layer over the devices, exposing at least some electrical contacts of the devices through the insulating layer and applying one or more conductors to the at least some electrical contacts. In a yet still additional embodiment, the step of mounting the rear faces of the die on a support carrier comprises, providing a support carrier having a principal surface carrying an adhesive, and attaching the rear faces of the devices to the adhesive. In still yet additional embodiment, the step of providing a support carrier having a principal surface carrying an adhesive, comprises providing a support carrier having a principal surface carrying a double-sided sticky-tape. In a further additional embodiment, the method comprises after the step of providing a plastic encapsulation, subjecting the plastic encapsulation to a vacuum treatment to at least partially remove voids.

According to a second exemplary embodiment, there is provided a method for forming a panel of multiple electronic devices, comprising, providing multiple electronic devices with first faces having bonding pads thereon, opposed rear faces, and edges extending between the first faces and rear faces, and having a sacrificial layer covering some or all of the boding pads, providing a temporary support having a principal face, mounting the multiple electronic devices on the temporary support with the sacrificial layer toward the principal face, providing plastic encapsulation at least between edges of adjacent multiple electronic devices on the temporary support, curing the plastic encapsulation at least sufficiently to substantially fix the multiple electronic devices in the encapsulation thereby forming the panel of multiple electronic devices on the temporary support, separating the panel of multiple electronic devices from the temporary support so that the sacrificial layer on the bonding pads is exposed, and removing the sacrificial layer. In a further embodiment, the method comprises after the curing step, removing any plastic encapsulation protruding beyond the rear faces of the multiple electronic devices. In a still further embodiment, the method further comprises mounting the panel on a carrier with the rear faces of the multiple electronic devices facing the carrier and the bonding pads exposed. In a yet further embodiment, the method further comprises applying one or more insulating layers over the multiple electronic devices, opening vias to at least some of the bonding pads, and providing conductive interconnects extending through at least one of the one more vias in the one more insulating layers to electrically couple some of the bonding pads to each other or to external connections to the panel.

According to a third exemplary embodiment, there is provided a method for forming a panel of multiple encapsulated electronic devices, comprising, forming a sacrificial layer on faces of the multiple electronic devices having electrical connection locations thereon, providing a temporary support carrier with an adhesive surface, sticking the multiple electronic devices to the adhesive surface by the sacrificial layer, applying encapsulation to the multiple electronic devices so that the encapsulation is in contact at least with lateral edges of the multiple electronic devices, curing the encapsulation to attach the multiple electronic devices together on the temporary support carrier without rendering the sacrificial layer insoluble, separating the multiple electronic devices and attached encapsulation from the temporary carrier, and removing the sacrificial layer and any encapsulation thereon. In a further embodiment, the method comprises mounting the electronic devices and attached encapsulation on a support carrier with the electrical connection locations facing outward. In a still further embodiment, the method comprises, forming one or more insulating layers over the outward facing electrical connection locations with conductors thereon penetrating the one or more insulating layers to some or all of the electrical connection locations, thereby forming a panel of multiple encapsulated electronic devices that are interconnected.

While at least one exemplary embodiment has been presented in the foregoing detailed description, it should be appreciated that a vast number of variations exist. For example, and not intended to be limiting, die 62 may be of any type and technology and not limited merely to the examples given. Similarly, while various preferred materials and packaging methods for the die panel are described herein, persons of skill in the art will understand that a large number of alternatives exist, for example, for the various support substrates and carriers and the adhesives and sacrificial layers used herein, and such are intended to be included in the scope of the claims that follow. Further, the exemplary implementations presented herein yield die panels in various stages of completion that are useful in intermediate as well as finished form and such are intended to be included within the scope of the claims that follow.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for encapsulating electronic devices, comprising:

providing one or more electronic devices, wherein each electronic device of the one or more electronic devices includes a primary face where electrical contacts are located, an opposed rear face, edges extending between the primary and rear faces, and a sacrificial layer on the primary face;

mounting each of the one or more electronic devices on a temporary support so that the sacrificial layer faces toward the temporary support;

providing plastic encapsulation in contact with the rear face and edges of each of the electronic devices;

at least partially curing the plastic encapsulation;

separating the electronic devices and at least that portion of the plastic encapsulation in contact with the edges of the electronic devices from the temporary support so that the sacrificial layer of each electronic device is exposed;

removing the sacrificial layer from each of the electronic devices;

mounting the rear face of each of the electronic devices on a support carrier;

applying an insulating layer over the electronic devices;

exposing at least some electrical contacts of the electronic devices through the insulating layer; and applying one or more conductors to the at least some electrical contacts.

2. The method of claim 1, wherein the mounting step comprises;

providing a temporary support having an adhesive layer on a principal surface; and attaching the electronic devices to the temporary support by placing the sacrificial layer in contact with the adhesive layer.

3. The method of claim 2, wherein the adhesive layer comprises a double-sided sticky-tape.

4. The method of claim 3, wherein the double-sided sticky-tape comprises a polyimide material.

5. The method of claim 1, wherein the step of at least partially curing the plastic encapsulation comprises, partially curing the plastic encapsulation without rendering the sacrificial layer insoluble.

6. The method of claim 1, further comprising prior to the separating step, backgrinding the plastic encapsulation to expose the rear faces of the one or more electronic devices.

7. A method for encapsulating electronic devices, comprising:
provinding one or more electronic devices with primary faces where electrical contacts are located, opposed rear faces, and edges extending between the primary and rear faces, and having a sacrificial layer on the primary faces;
mounting the one or more electronic devices on a temporary support so that the sacrificial layer faces toward the temporary support;
providing plastic encapsulation in contact with the rear faces and edges of the electronic devices;
at least partially curing the plastic encapsulation;
backgrinding the plastic encapsulation to expose the rear faces of the one or more electronic devices;
separating the devices and at least that portion of the plastic encapsulation in contact with the edges of the electronic devices from the temporary support so that the sacrificial layer is exposed;
removing the sacrificial layer;
after the step of removing the sacrificial layer, mounting the rear faces of the electronic devices on a support carrier;
applying an insulating layer over the electronic devices;
exposing at least some electrical contacts of the electronic devices through the insulating layer; and
applying one or more conductors to the at least some electrical contacts.

8. A method for encapsulating electronic devices, comprising:
providing one or more electronic devices with primary faces where electrical contacts are located, opposed rear faces, and edges extending between the primary and rear faces, and having a sacrificial layer on the primary faces;
mounting the one or more electronic devices on a temporary support so that the sacrificial layer faces toward the temporary support;
providing plastic encapsulation in contact with the rear faces and edges of the electronic devices;
at least partially curing the plastic encapsulatiom;
backgrinding the plastic encapsulation to expose the rear faces of the one or more electronic devices;
separating the devices and at least that portion of the plastic encapsulation in contact with the edges of the electronic devices from the temporary support so that the sacrificial layer is exposed;
removing the sacrificial layer;
after the step of removing the sacrificial layer, mounting the rear faces of the die on a support carrier;
after the step of mounting the rear faces of the die on a support carrier, further curing the plastic encapsulation; and
applying an insulating layer over the devices, exposing at least some electrical contacts of the devices through the insulating layer and applying one or more conductors to the at least some electrical contacts.

9. The method of claim 8, wherein the step of mounting the rear faces of the die on a support carrier comprises:
providing a support carrier having a principal surface carrying an adhesive; and
attaching the rear faces of the devices to the adhesive.

10. The method of claim 9, wherein the step of providing a support carrier having a principal surface carrying an adhesive, comprises providing a support carrier having a principal surface carrying a double-sided sticky-tape.

11. The method of claim 1, further comprising after the step of providing a plastic encapsulation, subjecting the plastic encapsulation to a vacuum treatment to at least partially remove voids.

12. A method for forming a panel of multiple electronic devices, comprising:
providing multiple electronic devices, wherein each electronic device of the multiple electronic devices includes a first face having bonding pads thereon, an opposed rear face, edges extending between the first face and the rear face, and a sacrificial layer covering some or all of the boding pads;
providing a temporary support having a principal face;
mounting each of the multiple electronic devices on the temporary support with the sacrificial layer toward the principal face;
providing plastic encapsulation at least between edges of adjacent multiple electronic devices on the temporary support;
curing the plastic encapsulation at least sufficiently to substantially fix the multiple electronic devices in the encapsulation thereby forming the panel of multiple electronic devices on the temporary support;
separating the panel of multiple electronic devices from the temporary support so that the sacrificial layer on the bonding pads of each of the multiple electronic devices is exposed;
removing the sacrificial layer from each of the multiple electronic devices;
mounting the rear face of each of the multiple electronic devices on a support carrier;
applying an insulating layer over the multiple electronic devices;
exposing at least some electrical contacts of the multiple electronic devices through the insulating layer; and
applying one or more conductors to the at least some electrical contacts.

13. The method of claim 12, further comprising after the curing step, removing any plastic encapsulation protruding beyond the rear faces of the multiple electronic devices.

14. The method of claim 13, further comprising mounting the panel on a carrier with the rear faces of the multiple electronic devices facing the carrier and the bonding pads exposed.

15. A method for forming a panel of multiple electronic devices, comprising:
providing multiple electronic devices with first faces having bonding pads thereon, opposed rear faces, and edges extending between the first faces and rear faces, and having a sacrificial layer covering some or all of the boding pads;
providing a temporary support having a principal face;
mounting the multiple electronic devices on the temporary support with the sacrificial layer toward the principal face;
providing plastic encapsulation at least between edges of adjacent multiple electronic devices on the temporary support;
curing the plastic encapsulation at least sufficiently to substantially fix the multiple electronic devices in the encapsulation thereby forming the panel of multiple electronic devices on the temporary support;

removing any plastic encapsulation protruding beyond the rear faces of the multiple electronic devices;

separating the panel of multiple electronic devices from the temporary support so that the sacrificial layer on the bonding pads is exposed;

removing the sacrificial layer;

mounting the panel on a carrier with the rear faces of the multiple electronic devices facing the carrier and the bonding pads exposed;

applying one or more insulating layers over the multiple electronic devices;

opening vias to at least some of the bonding pads; and providing conductive interconnects extending through at least one of the one more vias in the one more insulating layers to electrically couple some of the bonding pads to each other or to external connections to the panel.

16. A method for forming a panel of multiple encapsulated electronic devices, comprising:

forming a sacrificial layer on a face of each of the multiple electronic devices, wherein the face has electrical connection locations thereon;

providing a temporary support carrier with an adhesive surface;

sticking the sacrificial layer of each of the multiple electronic devices to the adhesive surface;

applying encapsulation to the multiple electronic devices so that the encapsulation is in contact at least with lateral edges of the multiple electronic devices;

curing the encapsulation to attach the multiple electronic devices together on the temporary support carrier without rendering the sacrificial layer of each of the multiple electronic devices insoluble;

separating the multiple electronic devices and attached encapsulation from the temporary carrier;

removing the sacrificial layer and any encapsulation thereon from each of the multiple electronic devices;

mounting the rear face of each of the multiple electronic devices on a support carrier;

applying an insulating layer over the multiple electronic devices;

exposing at least some electrical contacts of the multiple electronic devices through the insulating layer; and applying one or more conductors to the at least some electrical contacts.

17. The method of claim 16, further comprising, mounting the electronic devices and attached encapsulation on a support carrier with the electrical connection locations facing outward.

18. A method for forming a panel of multiple encapsulated electronic devices, comprising:

forming a sacrificial layer on faces of the multiple electronic devices having electrical connection locations thereon;

providing a temporary support carrier with an adhesive surface;

sticking the multiple electronic devices to the adhesive surface by the sacrificial layer;

applying encapsulation to the multiple electronic devices so that the encapsulation is in contact at least with lateral edges of the multiple electronic devices;

curing the encapsulation to attach the multiple electronic devices together on the temporary support carrier without rendering the sacrificial layer insoluble;

separating the multiple electronic devices and attached encapsulation from the temporary carrier;

removing the sacrificial layer and any encapsulation thereon;

mounting the electronic devices and attached encapsulation on a support carrier with the electrical connection locations facing outward; and forming one or more insulating layers over the outward facing electrical connection locations with conductors thereon penetrating the one or more insulating layers to some or all of the electrical connection locations, thereby forming a panel of multiple encapsulated electronic devices that are interconnected.

* * * * *